United States Patent
Kawai et al.

[11] Patent Number: 6,066,568
[45] Date of Patent: May 23, 2000

[54] PLASMA TREATMENT METHOD AND SYSTEM

[75] Inventors: Yoshinobu Kawai; Yoko Ueda, both of Fukuoka-ken; Nobuo Ishii, Osaka-fu; Satoru Kawakami; Hideaki Amano, both of Kanagawa-ken, all of Japan

[73] Assignee: Tokyo Electron Limited, Tokyo-to, Japan

[21] Appl. No.: 09/075,950

[22] Filed: May 12, 1998

[30] Foreign Application Priority Data

May 14, 1997 [JP] Japan .................................. 9-139414

[51] Int. Cl.⁷ .............................................. H01L 21/3065
[52] U.S. Cl. ........................ 438/707; 438/710; 438/714; 438/726; 438/728; 438/732
[58] Field of Search ..................... 438/627, 706, 438/710, 707, 714, 728, 726, 732; 156/345; 216/70; 118/723

[56] References Cited

U.S. PATENT DOCUMENTS

| | | | |
|---|---|---|---|
| 4,831,963 | 5/1989 | Saito et al. | 118/723 |
| 5,082,685 | 1/1992 | Morooka | 427/294 |
| 5,203,960 | 4/1993 | Dandl | 216/70 |
| 5,471,115 | 11/1995 | Hikosaka et al. | 315/11.21 |
| 5,580,420 | 12/1996 | Watamabe et al. | 156/345 |
| 5,627,105 | 5/1997 | Delfino et al. | 438/627 |

FOREIGN PATENT DOCUMENTS

| | | |
|---|---|---|
| 63-182822 | 7/1988 | Japan . |
| 63-213344 | 9/1988 | Japan . |
| 63-217620 | 9/1988 | Japan . |

Primary Examiner—Benjamin L. Utech
Assistant Examiner—Binh X. Tran
Attorney, Agent, or Firm—Smith, Gambrell & Russell, LLP Beveridge, DeGrandi, Weilacher & Young

[57] ABSTRACT

An electron density at an ECR point, which is spaced from a substrate to be treated and which faces the substrate, is set to be higher than or equal to 0.46 nc (nc: an upper limit side cut-off density of an X wave) and lower than nc. Thus, a high chevron distribution of electron density is formed in end portions of a magnetic field forming region, and a distribution of electron density having a lower peak value than those in the end portions is formed in a central portion of the magnetic field forming region. In this case, the periphery of a magnetic field crosses the inner wall of a vacuum chamber once between the ECR point and the substrate, and a space of one fourth or more of the wavelength of the X wave is formed between the periphery of the magnetic field and the inner wall of the vacuum chamber as the magnetic field runs downstream. Thus, it is possible to achieve an inplane uniform treatment when carrying out a treatment, such as a thin film deposition or etching, with ECR plasmas for a wafer.

8 Claims, 11 Drawing Sheets

PLASMA TREATMENT METHOD AND SYSTEM

BACKGROUND OF THE INVENTION

1. Field of the Invention

The present invention relates generally to a plasma treatment method using electron cyclotron resonance, and a system using the same.

2. Related Background Art

Recently, as a technique for carrying out a thin film deposition or etching with plasmas, the electron cyclotron resonance (ECR) plasma treatment method for causing a microwave discharge using a resonance phenomenon between the cyclotron motion of electrons and microwaves in a magnetic field has been widely noticed. According to this method, since high vacuum and high density plasmas can be produced by the electrodeless discharge, there are advantages in that it is possible to carry out a high-speed surface treatment and it is not likely that wafers will be contaminated.

Figure 16:
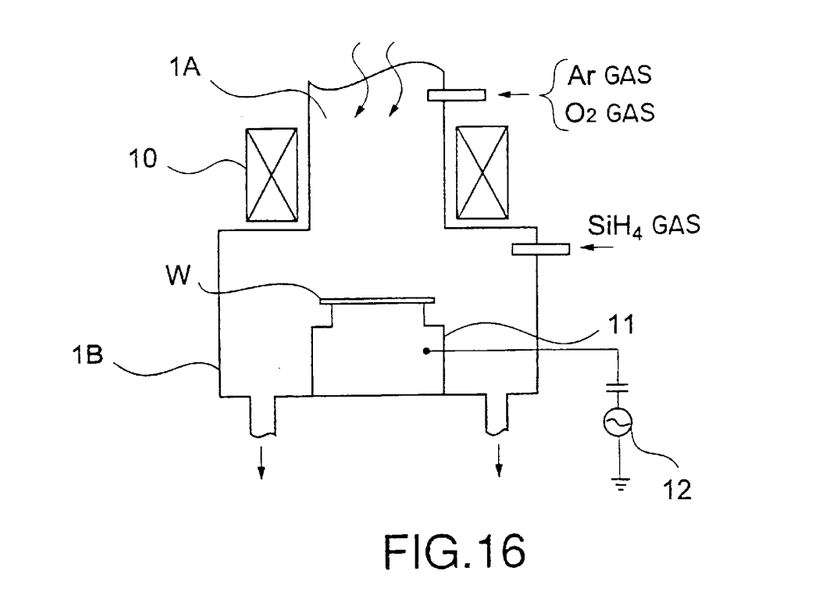
FIG. 16 is a schematic diagram showing a conventional plasma treatment system.

Referring to FIG. 16, an example of a conventional plasma treatment system for carrying out the ECR plasma treatment will be described by an example of a thin film deposition treatment. A microwave of, e.g., 2.45 GHz, is supplied to a plasma producing chamber 1A via a waveguide (not shown). Simultaneously, a magnetic field of a predetermined intensity, e.g., 875 gausses, is applied to the plasma producing chamber 1A by means of an electromagnetic coil 10 to produce high density plasmas of plasma producing gases, e.g., Ar gas and $O_2$ gas, by the interaction (resonance) between the microwave and the magnetic field. These plasmas activate a reactive gas, e.g., $SiH_4$ gas, which is introduced into a thin film deposition chamber 1B, to form an active species (for example, such as free radicals or ions), so that the sputter etching and the deposition simultaneously proceed on the surface of a silicon wafer W on a transfer table 11. The sputter etching operation and the deposition operation, which are contrary to each other, are controlled so that the deposition operation is macroscopically predominant over the sputter etching operation. Thus, the deposition is carried out as a whole.

By the way, with the scale down and high integration of the pattern of a semiconductor device, the thickness of a film, e.g., an interlayer insulator film, has been very thin. In addition, a demand for still finer patterning has been made, so that it has been demanded that a plasma treatment, such as the plasma deposition and the plasma etching, should achieve still higher inplane uniformity. Therefore, it is required to establish process conditions corresponding to such demands. However, since the behavior of the process has many unclear points, particularly since the history of the wafer treatment using the ECR is short, it is very difficult to design the system and to set the process conditions.

For example, the diameter of a chamber, the electron densities at various distances from a wafer, and the magnetic field gradient have been determined by trial and error. This operation needs a long time and much labor, and it is difficult for even an expert to carry out the operation. Therefore, it is not easy to carry out a plasma treatment achieving a high inplane uniformity, and a demand for establishing a technique for carrying out such a plasma treatment is made.

SUMMARY OF THE INVENTION

It is therefore an object of the present invention to eliminate the aforementioned problems and to provide a method and system, which can carry out a plasma treatment achieving a high inplane uniformity in a plasma treatment method using the ECR.

In order to accomplish the aforementioned and other objects, according to one aspect of the present invention, a plasma treatment method comprises the steps of: transferring a substrate to be treated, in a cylindrical vacuum vessel so as to be substantially perpendicular to an axis of the vacuum vessel; propagating a microwave in the direction of the axis, and forming a magnetic field so that lines of magnetic force run along the axis of the vacuum vessel; introducing a plasma producing gas into the vacuum vessel; assuming that an electron density at a position corresponding to an electron cyclotron resonance point in a central portion in a magnetic field forming region, in which the magnetic field is formed, is PD and that an upper limit side cut-off density of an X wave serving as an extraordinary wave is nc, and setting the electron density PD so that 0.46 nc≦PD<nc; and treating the substrate with plasmas produced by the electron cyclotron resonance.

In this case, a chevron distribution of electron density, in which the electron density is high at the position corresponding to the electron cyclotron resonance point in a surrounding portion of the magnetic field forming region, may be formed by setting the electron density PD so that 0.46 nc≦PD<nc, and a distribution of electron density may be formed so as to have a lower peak value at the position corresponding to the electron cyclotron resonance point in the central portion in the magnetic field forming region than that in the surrounding portion.

The magnetic field may be formed so that the periphery of the magnetic field expands outside of the inner wall of a vacuum vessel, which forms therein the vacuum chamber, downstream of the position corresponding to the electron cyclotron resonance with respect to the lines of magnetic force and the periphery of the magnetic field is positioned inside of the inner wall of the vacuum vessel by a distance of one fourth or more of the wavelength of the X wave more downstream thereof.

The electron density PD may be set by adjusting an magnitude of power of the microwave propagated in the direction of the axis. Alternatively, the electron density PD may be set by adjusting a flow rate of the plasma producing gas introduced into the vacuum chamber. In addition, the electron density PD may be set by adjusting a pressure in the vacuum chamber.

In the plasma treatment method, a position corresponding to an electron cyclotron resonance point in a surrounding portion of the magnetic field forming region may be positioned downstream of or the same horizontal plane as that of the position corresponding to the electron cyclotron resonance in the central portion in the magnetic field forming region with respect to the lines of magnetic force which run along the axis of the vacuum vessel.

The step of treating the substrate may comprise a step of depositing a thin film on the substrate. Alternatively, the step of treating the substrate comprises a step of etching the substrate.

According to the present invention, in a plasma treatment method using the ECR, it is possible to carry out a plasma treatment achieving a high inplane uniformity.

Furthermore, the present invention should be understood to include systems for carrying out such a treatment.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Before describing the preferred embodiments of the present invention, the fact and knowledge, on the basis of which a method according to the present invention has been made, will be described. The inventor has recognized that when the plasma treatment of a wafer is carried out by the ECR, the uniformity of a plasma treatment in the plane of a wafer, e.g., the uniformity of the thickness of a thin film in a thin film deposition process, is good if a distribution pattern of electron density, which is flat at the central portion and higher at both end portions than that at the central portion, is formed, as shown in FIG. 1, in a region, which is spaced from the wafer and which faces the wafer.

After examining what conditions and mechanisms form plasmas having such a distribution of electron density, it was found that an X wave related to the formation of such plasmas. The X wave is an elliptically polarized light wave (an electromagnetic wave) propagated across the lines of magnetic force, a so-called extraordinary wave. When the electron density is increased to a certain value, the X wave is not produced. This value is called a cut-off density. However, when the electron density is decreased to a certain value, the X wave is not also produced. Therefore, the cut-off density strictly exists on the upper limit side and the lower limit side. The present invention makes an issue of the cut-off density on the upper limit side.

Figure 1:
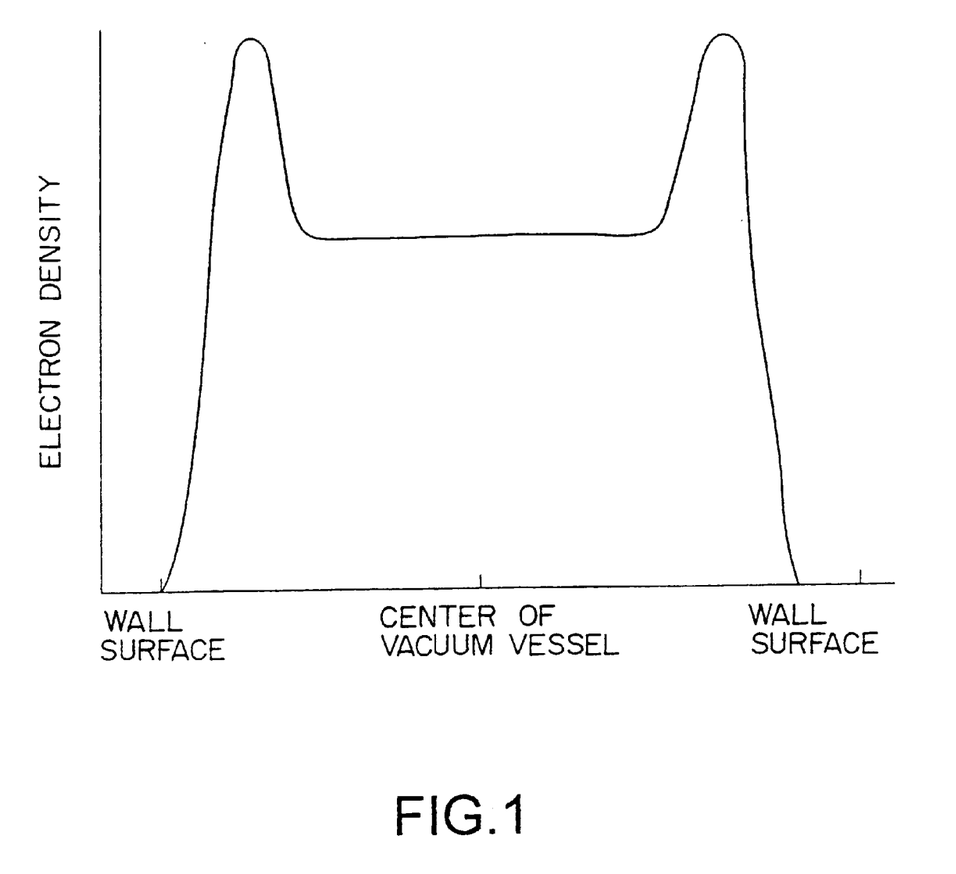
FIG. 1 is a characteristic diagram showing an ideal distribution pattern of electron density.

The present invention has been made on the basis of the fact that it was found that the distribution pattern of electron density shown in FIG. 1 was formed when the electron density was slightly smaller than the cut-off density on the upper limit side. The preferred embodiments of the present invention, the distribution patterns of electron density, the relationships to X waves will be described in detail below.

Figure 2:
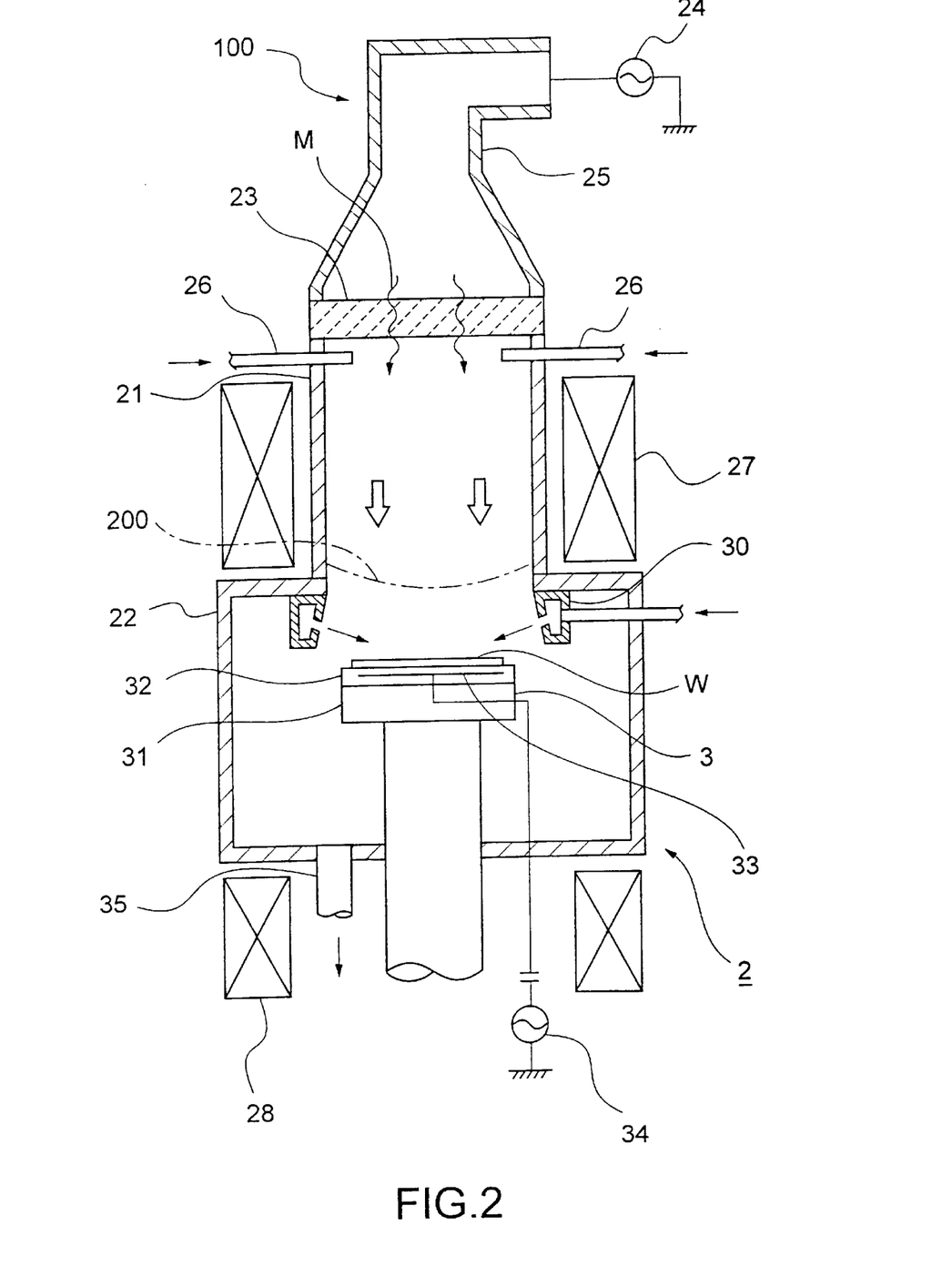
FIG. 2 is a longitudinal section of an embodiment of a plasma treatment system for carrying out a preferred embodiment of a plasma treatment method according to the present invention.

FIG. 2 shows an embodiment of a plasma treatment system for use in a preferred embodiment of a plasma treatment method according to the present invention. As shown in FIG. 2, a plasma treatment system 100 has a vacuum vessel 2 of, e.g., aluminum. The vacuum vessel 2 comprises a first cylindrical vacuum chamber 21 arranged in the upper portion for producing a plasma, and a second cylindrical vacuum chamber 22, which is arranged below the first vacuum chamber 21 to be connected so as to be communicated therewith. Furthermore, the vacuum vessel 2 is grounded to be zero potential.

The upper end of the vacuum vessel 2 is open, in which a member capable of transmitting a micro wave, e.g., a transmission window 23 of a material, such as quartz, is airtightly provided so as to maintain the vacuum state in the vacuum vessel 2. Outside of the transmission window 23, there is provided a waveguide 25 connected to a high-frequency power supply part 24 serving as a high-frequency supply means for producing a plasma of, e.g., 2.45 GHz. A microwave M produced by the high-frequency power supply part 24 can be guided by the waveguide 25 in, e.g., TE mode, to be introduced from the transmission window 23 into the first vacuum chamber 21.

In the side wall for dividing the first vacuum chamber 21, plasma gas nozzles 26 are arranged, e.g., at regular intervals in the circumferential directions thereof. The nozzles 26 are connected to plasma gas sources (not shown), e.g., Ar gas source and $O_2$ gas source, so that plasma gases, such as Ar and $O_2$ gases, can be uniformly supplied to the upper portion in the first vacuum chamber 21. Furthermore, although only two nozzles 26 are shown in the drawing to simplify the drawing, two or more nozzles 26 are provided in fact.

As a magnetic field forming means, e.g., a ring-shaped main electromagnetic coil 27 is arranged around the sidewall, which divides the first plasma chamber 21, so as to be adjacent to the side wall thereof, and a ring-shaped auxiliary electromagnetic coil 28 is arranged below the second vacuum chamber 22, so that a magnetic field B of, e.g., 875 gausses, can be formed in the first plasma chamber 21 and the second plasma chamber 22 so as to extend from top to bottom. Thus, the ECR plasma conditions are met. Furthermore, permanent magnets may be used in place of the electromagnetic coils.

Thus, the microwave M having the controlled frequency and the magnetic field B are formed in the first vacuum chamber 21, so that the above described ECR plasmas are produced by the interaction therebetween. At this time, a resonance function occurs in the introduced gas at the above described frequency to form plasmas at a high density. That is, this system forms an electron cyclotron resonance (ECR) plasma treatment system.

On the other hand, in the upper portion of the second vacuum chamber 22, i.e., in the portion of the second vacuum chamber 22 being communicated with the first vacuum chamber 21, a ring-shaped thin-film deposition gas supply part 30 is provided so that a thin film deposition gas is jetted from the inner peripheral surface of the gas supply part 30. In the second vacuum chamber 22, a transfer table 3 is provided so as to be movable in vertical directions. The transfer table 3 comprises a body 31 of, e.g., aluminum, and an electrostatic chuck 32, which is provided on the body 31 and which has a heater therein. An electrode 33 of the electrostatic chuck 32 is connected to, e.g., a high-frequency power supply part 34, so that a bias voltage for drawing ions into a wafer W is applied thereto. To the bottom of the second vacuum chamber 22, an exhaust pipe 35 is connected.

A method for forming an interlayer insulator film of, e.g., an $SiO_2$ film, on a wafer W serving as an object to be treated, by means of the above described system will be described below.

First, a gate valve (not shown) formed in the side wall of the vacuum vessel 2 is open, and a wafer W serving as an object to be treated, on the surface of which an interconnection layer of aluminum has been formed, is introduced from a load-lock chamber (not shown) to be transferred onto the transfer table 3 by means of a transport arm (not shown).

Subsequently, after the gate valve is closed to seal the interior of the vacuum vessel 2, the internal atmosphere is exhausted via the exhaust pipe 35, and the interior of the vacuum vessel 2 is evacuated to a predetermined degree of vacuum. Then, plasma producing gases, e.g., Ar and $O_2$ gases, are introduced from the plasma gas nozzles 26 into the first vacuum chamber 21, and a thin film deposition gas, e.g., $SiH_4$ gas, is introduced from the thin-film deposition gas supply part 30 into the second vacuum chamber 22 at a predetermined flow rate. Then, the pressure in the vacuum vessel 2 is maintained to be a predetermined process pressure, and a bias voltage of 13.56 MHz and 1500 W is applied to the transfer table 3 by means of the high-frequency power supply part 34 while the surface temperature of the transfer table 3 is set to be about 300° C.

A high frequency wave (a micro wave) of 2.45 GHz produced by the plasma producing high-frequency power supply part 24 is carried in the waveguide 25 to the ceiling portion of the vacuum vessel 2, so that the microwave M is introduced into the first vacuum chamber 21 via the transmission window 23. In the first vacuum chamber 21, a mirror field B produced by the magnetic coils 27 and 28 is applied at an intensity of, e.g., 875 gausses, from top to bottom. The interaction between the magnetic field B and the microwave M induces E (electric field)×B (magnetic field) to cause electron cyclotron resonance, which produces plasmas of Ar and $O_2$ gases and increases the density thereof. Furthermore, the plasmas are stabilized using Ar gas.

The plasma flow, which has flowed into the second vacuum chamber 22 from the plasma producing chamber 21, activates $SiH_4$ gas, which has been supplied therein, to form active species (for example, such as free radicals or ions).

On the other hand, plasma ions, i.e., Ar ions in this embodiment, are drawn into the wafer W by the plasma drawing bias voltage to chip off the corners of an $SiO_2$ film, which has been deposited on a pattern (a recessed portion) in the surface of the wafer W, by the sputter etching function of Ar ions to deposit the $SiO_2$ film while expanding the frontage thereof, so that the $SiO_2$ film is embedded into the recessed portion.

In the above described preferred embodiment, the electric power of the microwave and the pressures in the vacuum chambers 21 and 22 are adjusted so that the electron density is slightly smaller than the cut-off density nc of the X wave in the central portion in a region of an ECR point 200 (a position at which the ECR conditions are met), i.e., in a region wherein the intensity of magnetic field is 875 gausses, e.g., in a region which is spaced from the wafer W by about ten and a few centimeter. For example, the pressure is set to be in the range of from 1 mTorr to 5 mTorr. Thus, if the electron density is set to be slightly smaller than the nc in the central portion of the vacuum chamber 22 at the ECR point 200, the distribution pattern of electron density shown in FIG. 1 is formed in the vicinity of the ECR point. Furthermore, although the setting of the electron density in the central portion can be carried out by adjusting the electric power of the microwave and the pressures in the vacuum chambers 21 and 22 as described above, it can be also carried out by adjusting the flow rate of the $SiH_4$ gas or the like.

Figure 3:
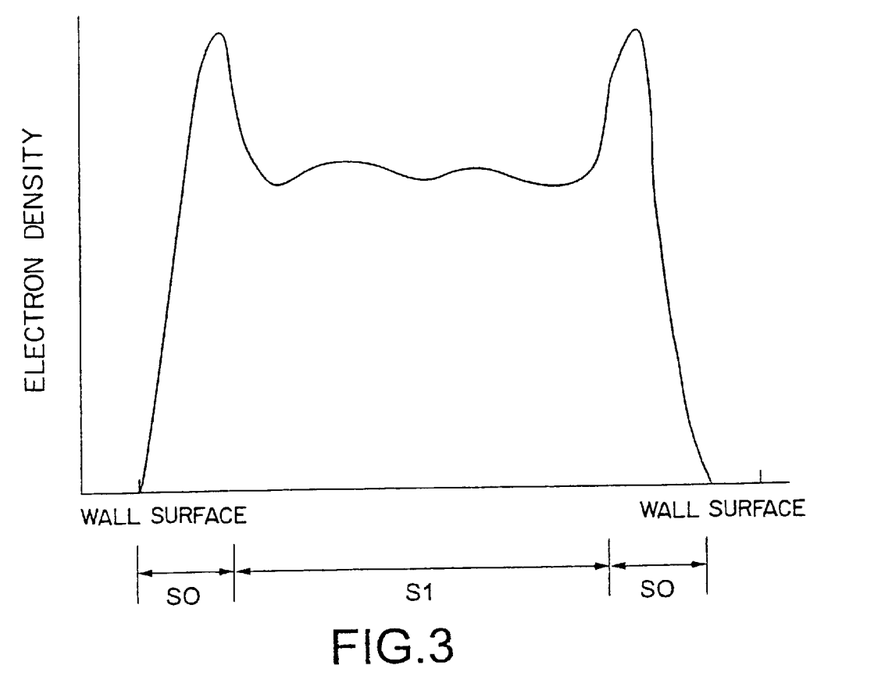
FIG. 3 is a characteristic diagram showing a distribution pattern of electron density measured by the plasma treatment system of FIG. 2.

As described later, the cut-off density nc is determined by the frequency of the microwave and the intensity of the magnetic field. In this embodiment, the cut-off density nc is $1.5 \times 10^{11}/cm^3$. Therefore, if the electron density in the above described region is set to be slightly smaller than the nc, a chevron distribution of electron density having a high peak of electron density is formed in the end regions S0 of the plasma forming region as shown in FIG. 3, and a substantially flat distribution of electron density is formed in the central region S1. Such a distribution pattern of electron density is formed on the basis of the production of the X wave. As described above, the X wave is propagated in a direction perpendicular to the lines of magnetic force, and the wavelength thereof is determined by formula (1).

$$(c^2 k^2/\omega^2) = (\omega_p^2/\omega^2) \cdot (\omega^2 - \omega_p^2)/(\omega^2 - \omega_h^2) \quad (1)$$

wherein c: speed of light k: wave number ($2\pi/\lambda$, $\lambda$: wavelength)

$\omega$: $2\pi f$ (f: frequency of microwave)

$\omega_p$: angular frequency of plasma $$\left(\frac{n_e \cdot e^2}{\varepsilon_0 \cdot m}\right)^{1/2} = 2\pi f_p = 2\pi \times 9000 \times \sqrt{n_e} = \omega_p$$

$\omega_h$: high frequency, $\omega_h^2 = \omega_p^2 + \omega_c^2$ $\omega_c$: cyclotron frequency, $(eB/m)^{1/2}$ $n_e$: electron density e: elementary electric charge m: mass of electron B: magnetic field Since the electron density in the central region S1 in the first vacuum chamber 21 is known, $\omega_p$ is determined. In addition, since $\omega$ is 2.45 GHz and B is 875 gausses, the wavelength $\lambda$ of the X wave can be derived by the formula (1). Therefore, in the central region S1, the standing wave of the X wave exists over the length of $(\frac{1}{2}\lambda) \times n$ (n: integer). In the end regions S0, X waves having short lengths exist by resonance phenomenon, so that the field intensity increases to form the distribution pattern of electron density shown in FIG. 3.

When the electron density is further decreased, the W wave is propagated as a standing wave of a certain wavelength from the wall of the vacuum chamber 21 to the facing wall thereof. Consequently, the field intensity is controlled by a whistler mode, so that the distribution pattern of electron density is a chevron pattern, which has a high electron density in the central portion.

That is, assuming that the electron density in the central portion of the vacuum chamber 22 at the ECR point 200 is PD, the PD being slightly smaller than the nc is limited to 0.46 nc. If the PD is smaller than 0.46 nc, the distribution pattern of electron density is a chevron pattern, which has a high electron density in the central portion, so that a desired pattern can not be obtained.

The cut-off density of the X wave can be derived as $n_e$ when the wavelength $\lambda$ is infinity, e.g., when k=0, in the formula (1).

To the contrary, when the electron density is very approximate to the cut-off density, the production of the X wave is biased in the vicinity of the inner wall, so that the electron density is low in the central region S1 like a trough, thereby deteriorating the inplane uniformity in the plasma treatment for the wafer.

Therefore, when the electron density PD is increased to the cut-off density nc, it is possible to obtain a desired pattern of electron density, so that it is required that PD<nc. In view of the foregoing, it is required that 0.46 nc≦PD<nc.

Figure 4:
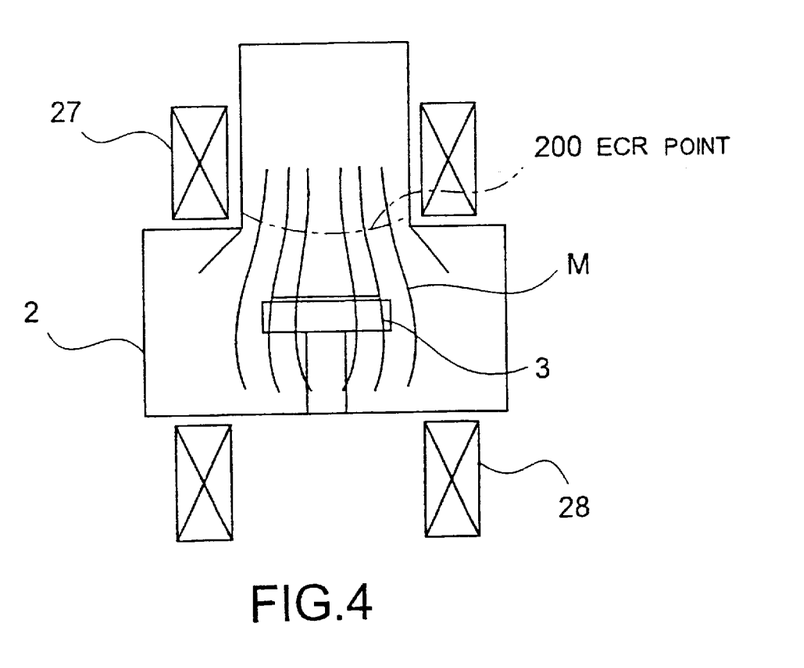
FIG. 4 is a schematic diagram showing a magnetic field in the plasma treatment system of FIG. 2.

By the way, in the plasma treatment system shown in FIG. 2, a mirror field is formed by the main electromagnetic coil 27 and the auxiliary electromagnetic coil 28 as shown in FIG. 4. The mirror field is formed so that the lines of magnetic field on the lower side approach the center thereof without remaining expanded when viewing the group of lines of magnetic field in the whole vacuum vessel 2. Although the lines of magnetic field from a position, at which the distribution of electron density shown in FIG. 3 is formed, to a position corresponding to the height of the wafer W run in the vicinity of the center in a direction substantially perpendicular to the wafer, these lines are expanded downwards in outside regions.

Figure 5:
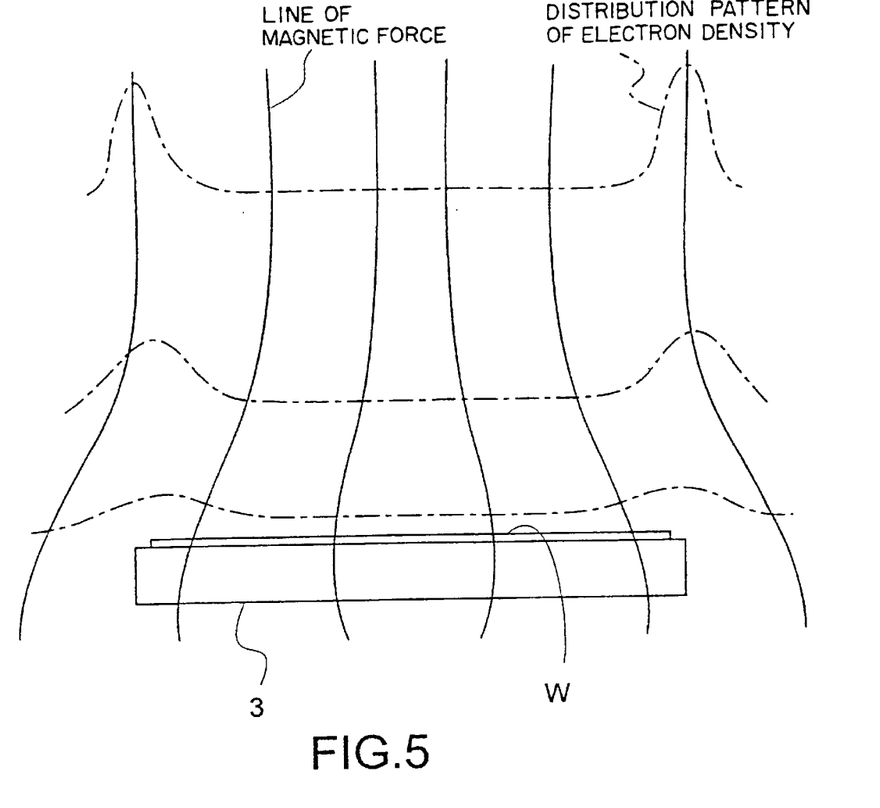
FIG. 5 is a schematic diagram showing the variation in electron density pattern as approaching a wafer.

On the other hand, since electrons move downwards while being wrapped around the lines of magnetic field, the plasmas in the end portions are expanded outwardly to be thin when approaching a position corresponding to the height of the wafer W as shown in FIG. 5. Therefore, the electron density decreases in the end portions, so that the electron density on the surface of the wafer W is uniform. Thus, it is possible to carry out a thin film deposition treatment achieving a high uniformity, e.g., in the inplane thickness.

According to this preferred embodiment, it is possible to form an electron density pattern approximating the pattern shown in FIG. 1 by setting the electron density to be slightly smaller than the cut-off density of the X wave without relying upon trial and error like conventional methods, so that it is possible to surely and easily achieve a uniform plasma treatment.

Since the cut-off density of the X wave is about $1.5 \times 10^{11}$ cm$^3$ when the frequency of microwave is 2.45 GHz and the intensity of magnetic field is 875 gausses, the electron density to be set in the system is in the range of 0.46×1.5× $10^{11}$/cm$^3$ $(7 \times 10^{10}/cm^3) \leq PD < 1.5 \times 10^{11}/cm^3$. Such an electron density can be obtained by adjusting the microwave power and the pressure.

Figure 6:
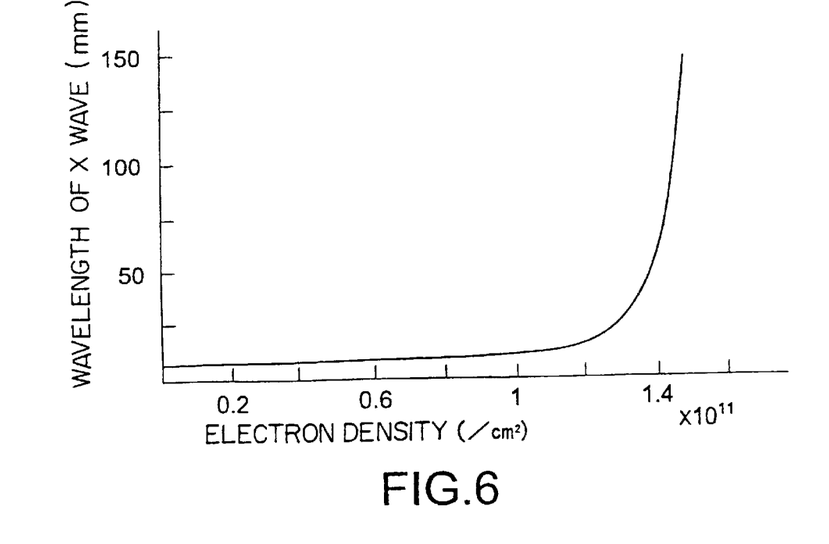
FIG. 6 is a characteristic diagram showing the relationship between the electron density and the wavelength of an X wave.

On the other hand, when the frequency of microwave and the intensity of magnetic field are determined, the relationship between the wavelength $\lambda$ of the X wave and the electron density $n_e$ (electron density) is determined. FIG. 6 is a graph showing the relationship between $\lambda$ and $n_e$ in the above described conditions. On the basis of this graph and the wafer size, it is possible to determine an appropriate inner diameter of the first vacuum chamber 1.

Figure 7:
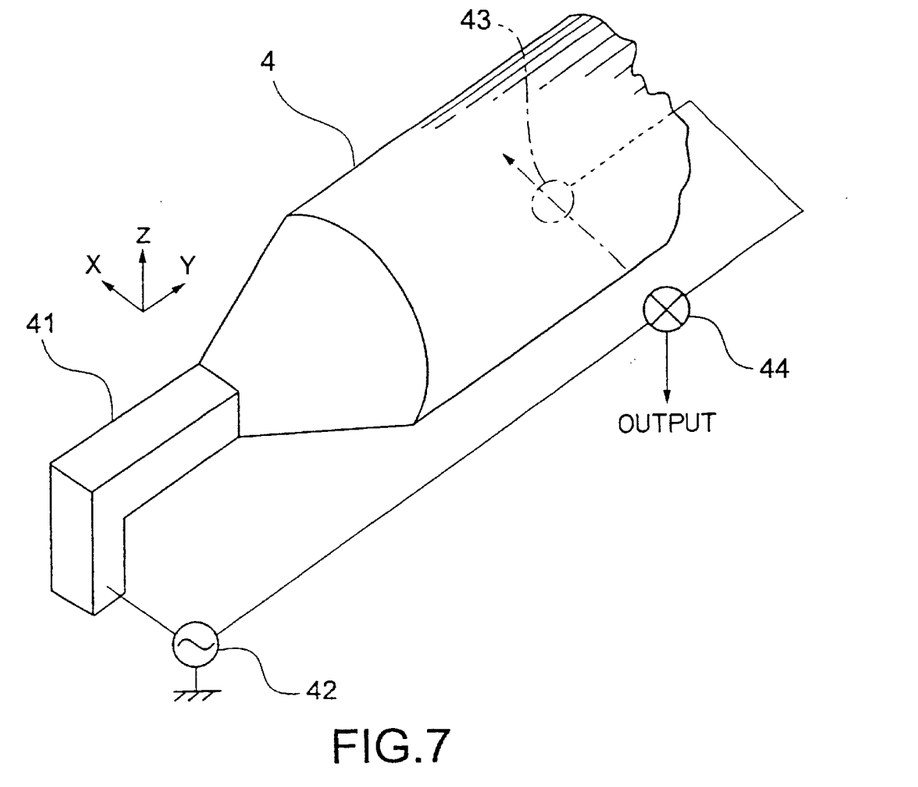
FIG. 7 is a schematic perspective view of an experimental device used for examining the presence of an X wave.

The inventor conducted the following experiment using an experimental device shown in FIG. 7 in order to ascertain the presence of the X wave. In FIG. 7, reference number 4 denotes a cylindrical vacuum vessel, 41 denotes a waveguide, 42 denotes a high-frequency power supply part, 43 denotes a circular loop antenna, and 44 denotes a mixer. The loop antenna 43 is movable in a direction (x direction, the direction of a chain line arrow) perpendicular to the longitudinal direction (y direction) of the vacuum vessel 4. The circle of the loop portion is in the yz plane. A microwave of 2.45 GHz was introduced in TE11 mode from the power supply part 42 into the vacuum vessel 4, and a magnetic field of 875 gausses was formed by means of an electromagnetic coil (not shown) wound onto the vacuum vessel 4. In addition, while maintaining the pressure in the vacuum vessel 4 to be 2 mTorr, nitrogen gas was fed into the vacuum vessel 4 to produce plasmas by the ECR. Then, the antenna 43 was moved radially along the chain line arrow from one end to the other end to obtain a mixed output of a signal wave corresponding to the microwave from the high-frequency power supply part 42 with an output detected by the antenna 43.

Figure 8:
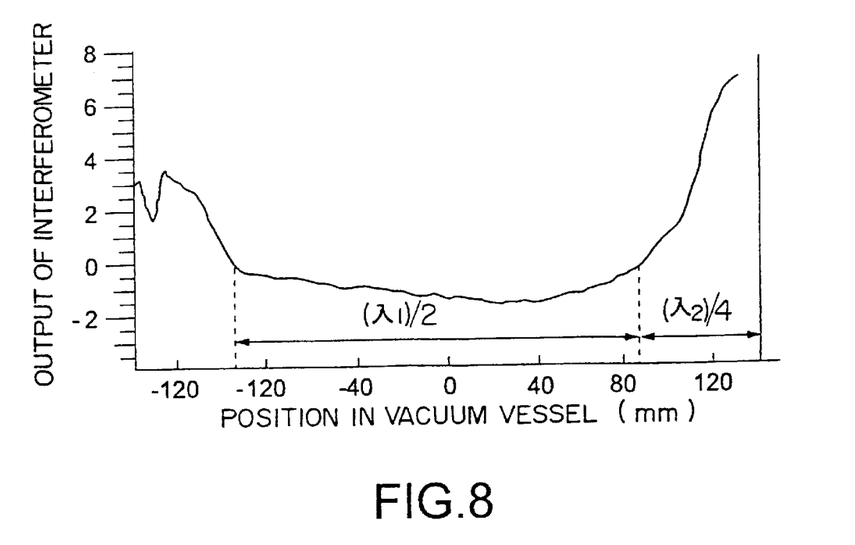
FIG. 8 is a characteristic diagram showing the results of the experiment carried out by the device of FIG. 7.

This method is called the interference method. Assuming that the microwave in the high-frequency power supply part 42 is $I_1 \cos \omega t$ and the microwave at the position of the antenna 43 is $I_2 \cos(\omega t - \theta)$, the mixer 44 serving as an interferometer outputs a value corresponding to the cosine component of a phase difference $\theta$. FIG. 8 is a graph showing the relationship between the position of the antenna 43 and the output of the interferometer when the microwave power is 1500 W. The position of the antenna 43 is biased toward the power supply part (upstream) from the ECR point (the position having a magnetic field of 875 gausses), and the intensity of magnetic field at the position of the antenna 43 is 900 gausses. The output of the interferometer is a constant value since $\theta$ should be constant if no electromagnetic wave crosses the magnetic field. In the results of FIG. 8, the output is not constant, and the distance between adjacent crests or troughs is a wavelength of a relevant electromagnetic wave. In FIG. 8, $(\lambda_1)/2$ is 18.4 cm, and the wave number is 0.17. In addition, $(\lambda_2)/4$ is 5.2 cm, and the wave number is 0.30.

Figure 9:
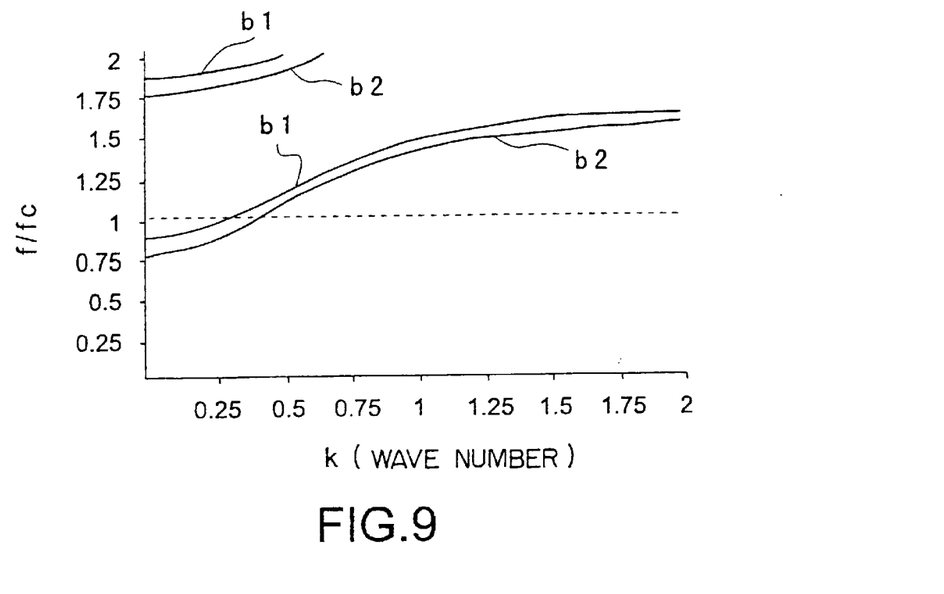
FIG. 9 is a characteristic diagram showing dispersion curves relating to X waves.

On the other hand, the electron density is determined by the formula (1), so that the relationship between f/fc (frequency of microwave/electron cyclotron frequency) and the wavelength $\lambda$ of the X wave is established. When this relationship is expressed as dispersion curves, FIG. 9 is obtained. In FIG. 9, b1 and b2 show dispersion curves when the electron density is $1.3 \times 10^{11}/cm^3$ and $1.1 \times 10^{11}/cm^3$, respectively. Where the wavelengths were derived from FIG. 8 and plotted by black circles in FIG. 9, the plotted circles were on the dispersion curves. Therefore, it was confirmed that the X wave was propagated in the direction of the chain line arrow in the vacuum vessel 4 shown in FIG. 7.

Figure 10:
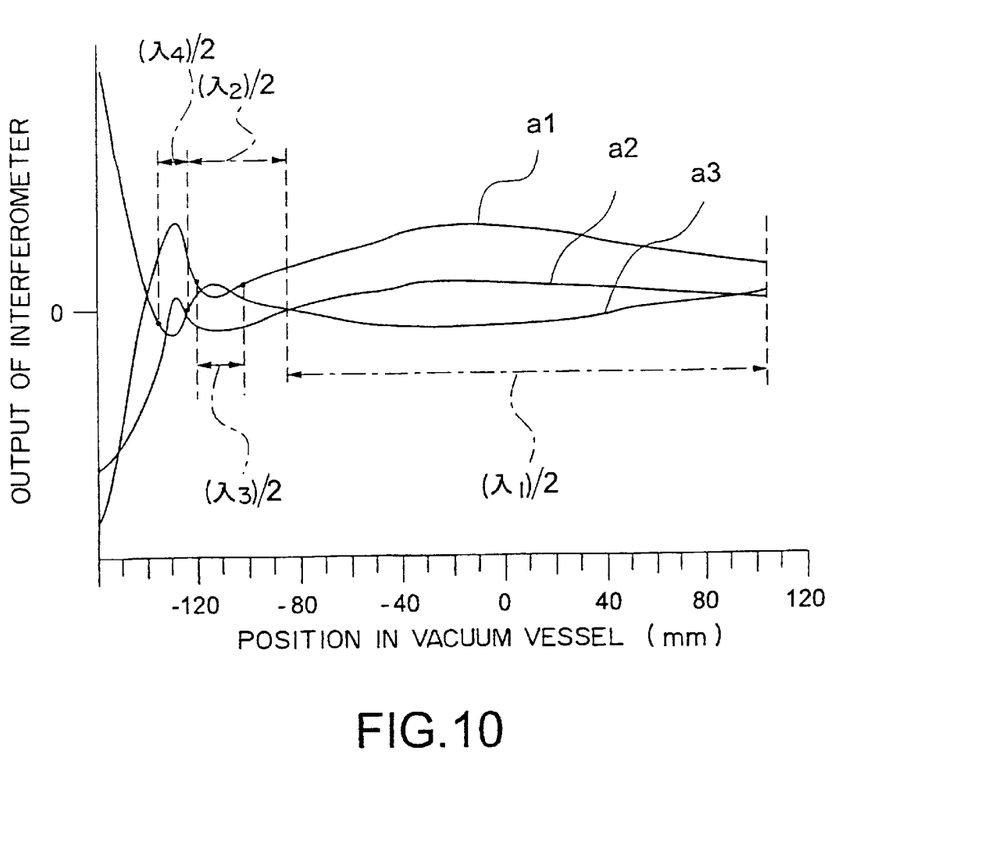
FIG. 10 is a characteristic diagram showing the results of the experiment carried out by the device of FIG. 7.
Figure 11:
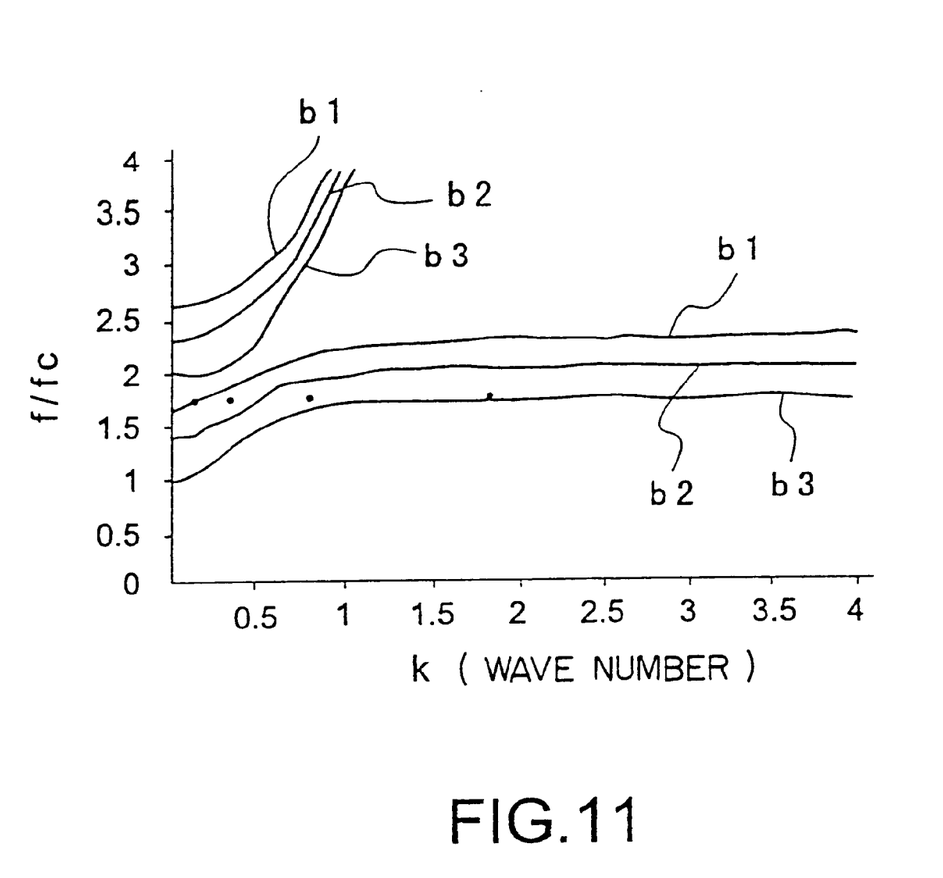
FIG. 11 is a characteristic diagram showing dispersion curves relating to X waves.

FIG. 10 shows the relationship between the position of the antenna 43 and the output of the interferometer when the position of the antenna 43 is biased downstream of the ECR point. In FIG. 10, a1, a2 and a3 have different phases. Furthermore, the intensity of the magnetic field is 500 gausses, and the microwave power is 1500 W. Although data could not be obtained in the right end portion for certain reasons for a measuring apparatus, the data in the right end portion are the same as those in the left end portion. In this case, the dispersion curves are shown as FIG. 11. In FIG. 11, b1, b2 and b3 have electron densities of $1.1\times10^{11}/cm^3$, $8\times10^{10}/cm^3$ and $5\times10^{10}/cm^3$, respectively. Where the wavelengths were derived from FIG. 10 and plotted by black circles in FIG. 11, the plotted circles were on the dispersion curves. Therefore, it was confirmed that the X wave was propagated also at this position of the antenna 43 in the direction of the chain line arrow in the vacuum vessel 4 shown in FIG. 7.

Thus, the X wave is propagated in a direction perpendicular to the magnetic field. In view of the relationship between the electron density and the distribution pattern of electron density in the central portion of the vacuum vessel in the vicinity of the cut-off density of the X wave, it can be seen that the distribution pattern of electron density approximating the distribution of electron density shown in FIG. 1 can be obtained by setting the electron density in the central region, in which the standing wave of the X wave exists, to be slightly smaller than the cut-off density of the X wave.

Figure 12:
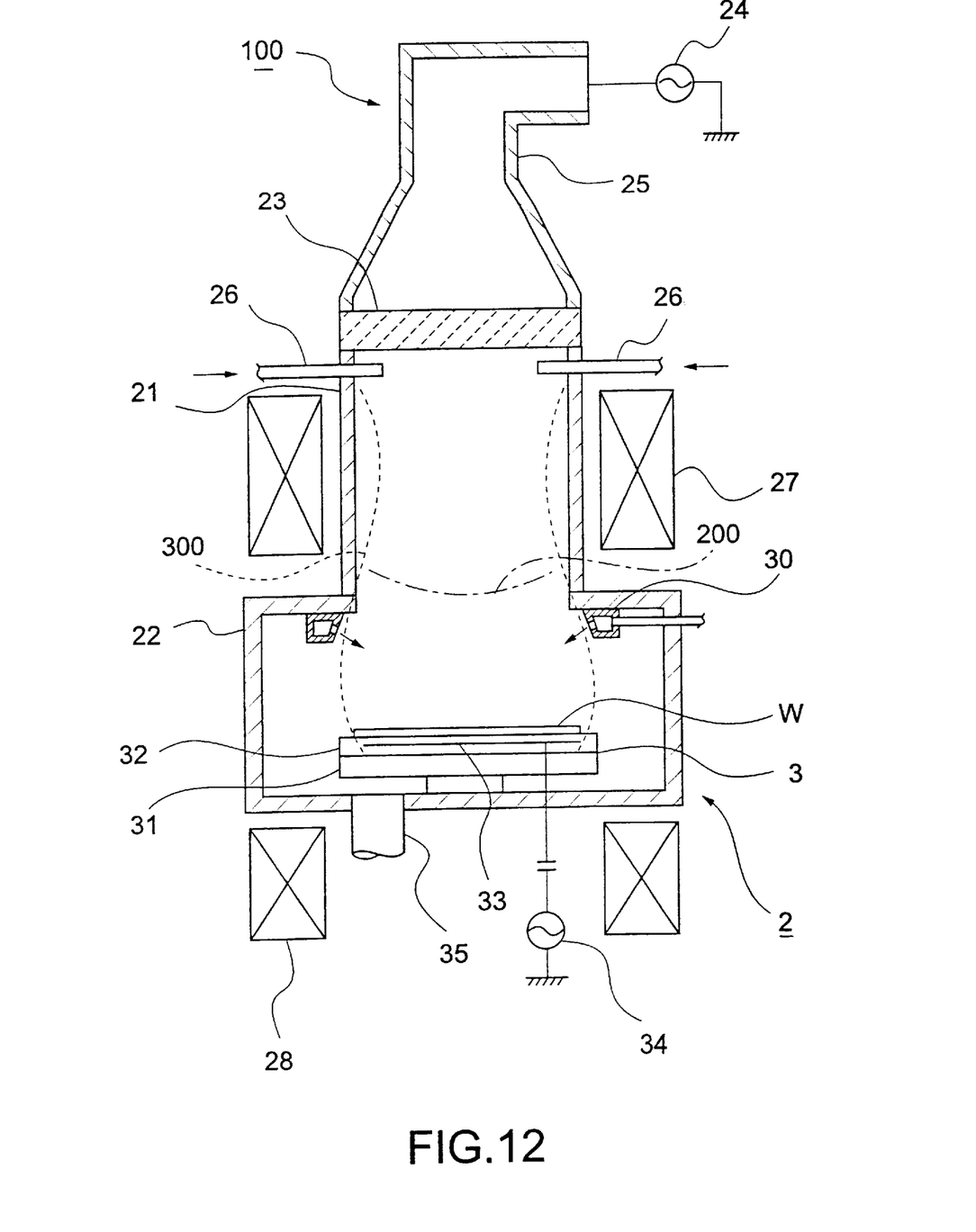
FIG. 12 is a longitudinal section of an embodiment of a plasma treatment system for carrying out another preferred embodiment of a plasma treatment method according to the present invention.
Figure 13:
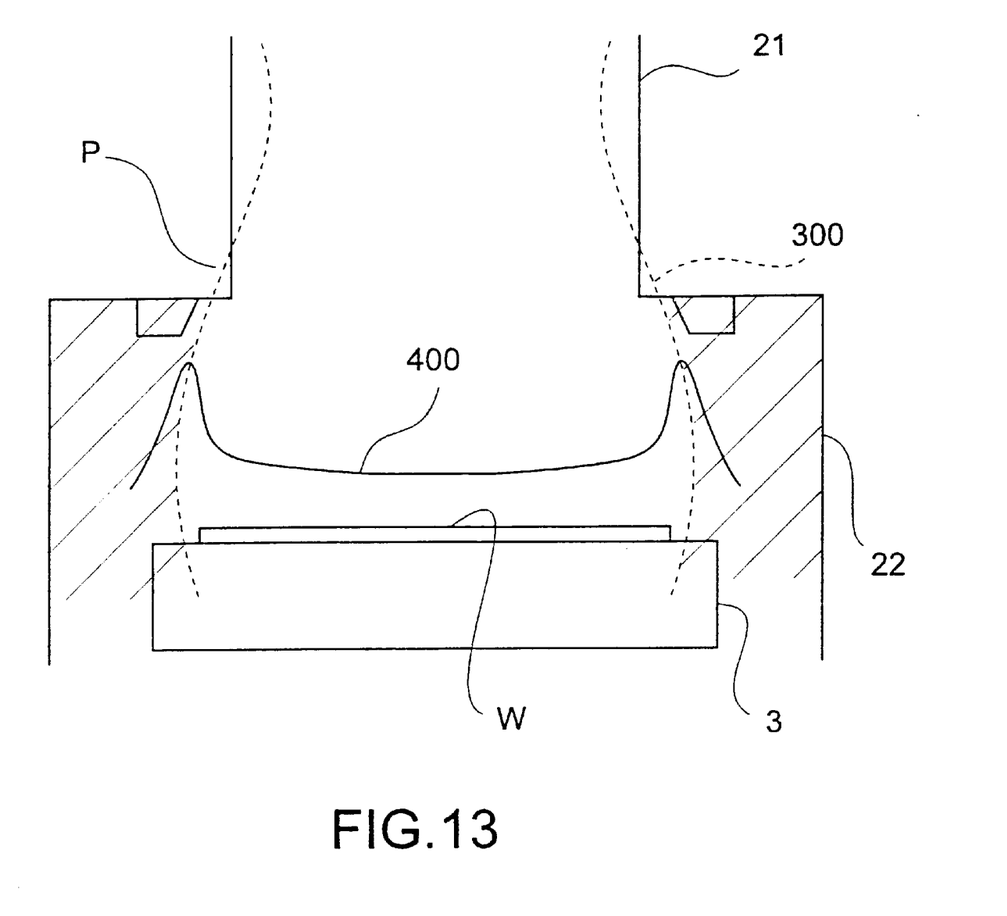
FIG. 13 is a characteristic diagram showing a distribution pattern of electron density measured by the plasma treatment system of FIG. 12.

Referring to FIGS. 12 and 13, another preferred embodiment of the present invention will be described below.

Also in this preferred embodiment, the electron density PD at the ECR point 200 is set to be in the range of $0.46\ nc \leq PD < nc$ with respect to the cut-off density nc of the X wave, similar to the above described preferred embodiment. However, the magnetic field is formed as follows. That is, the magnetic field is formed as a mirror field so that the periphery (shown by dotted lines in FIGS. 12 and 13) 300 of the magnetic field is positioned outside of the inner wall of the vacuum chamber 21 downstream of the ECR point 200 and positioned inside of the inner wall of the vacuum chamber 22 more downstream thereof. That is, after the magnetic field crosses the inner wall of the vacuum vessel 2 outwards at point P once, a space shown by slant lines in FIG. 13 is formed between the inner wall (the inner wall of the vacuum vessel 22 in this embodiment) and the periphery 300 of the magnetic field. Furthermore, the inner wall described herein does not include only the inner wall surface itself, but it also includes a conductive gas supply member as a part of the inner wall when the conductive gas supply means is provided so as to contact the inner wall surface in the circumferential directions thereof.

The lateral distance of the space, i.e., the distance between the periphery 300 of the magnetic field and the vacuum chamber 22, must be $\lambda/4$ or more assuming that the wavelength of the X wave is $\lambda$. However, it is not required that any sites should meet this condition, and it is sufficient for this condition to be met locally between the wafer W on the transfer table 3 and the point P.

FIG. 13 is a schematic diagram showing the magnetic field overlapped with the distribution of electron density. For example, a radial distribution pattern 400 of electron density at the antinode of the magnetic field has chevrons at the end portions thereof, each of the chevrons having a high peak of electron density, and a substantially flat pattern in the central portion thereof so that both ears are formed in a longitudinal section.

It is conceived that the reason for this is as follows. That is, modes existing in plasmas are R (whistler) waves, L waves and X waves. Among these waves, the R waves and X waves have resonance conditions. Since the R waves do not exist downstream of the ECR point, it can be conceived that only the X waves take part in resonance downstream of the ECR point. By the way, since electromagnetic waves exist up to an electron density of about $10^{11}/cm^3$ downstream of the ECR point, it is conceived that the L waves are propagated in a longitudinal direction of the vacuum vessel 2 and the X waves are propagated in a radial direction thereof so that the high frequency hybrid resonance thereof supplies a microwave power to plasmas. When the lines of magnetic forces are cut (at point P) on the inner wall of the vacuum vessel 22, a region having no plasma exists on the condition that the plasmas move along the lines of magnetic force. Furthermore, the plasmas described herein do not include damp plasmas emitting no light.

Therefore, the radial distribution of electron density decreases rapidly to some extent at the periphery of the lines of magnetic force, so that the medium rapidly changes therein to form a boundary for the X wave to reflect the X waves to form standing waves. It has been ascertained by measurement that a part of the X waves are progressive waves, which apply energy to plasmas. That is, the boundary region, in which the electron density decreases, is a place where the X waves supply power to plasmas. In this boundary region, the electron density is higher than that in the central portion. However, when the distance between the periphery of the magnetic field and the inner wall of the vacuum vessel 22 is shorter than one fourth of the wavelength $\lambda$ of the X wave, no X wave is produced, so that the distribution pattern of electron density shown in FIG. 13 can not be obtained. In this preferred embodiment, the wavelength of the X wave is about 16 cm, and $\lambda/4$ is about 4 cm.

According to this preferred embodiment, since the distribution pattern of electron density shown in FIG. 13 can be obtained above the wafer W, it is possible to carry out a uniform plasma treatment on the wafer W by adjusting the shape of the magnetic field as described above. Furthermore, even if the mirror field is not formed unlike this preferred embodiment, e.g., even if a simple cylindrical vacuum vessel is used to form a divergent field, which is divergent as the field approaches the wafer W, so as to form no space between the inner wall of the vacuum vessel and the periphery of the magnetic field, or even if the radial length is less than one fourth of the wavelength of the X wave even if the space exists, the distribution pattern of electron density having high electron densities in the end portions as shown in FIG. 1 can be obtained at the ECR point, and this moves downwards to the wafer W along the magnetic field as shown in FIG. 5 to be reflected in the distribution of electron density on the surface of the wafer W, so that there is an advantage in carrying out an inplane uniform plasma treatment. However, if the mirror field shown in FIGS. 12 and 13 is formed, the pattern of high electron density in the end portions can be formed in the vicinity of the wafer W, and it can be reflected in the distribution of electron density on the surface of the wafer W at a very great degree of freedom, so that the mirror field is more preferred.

Figure 14:
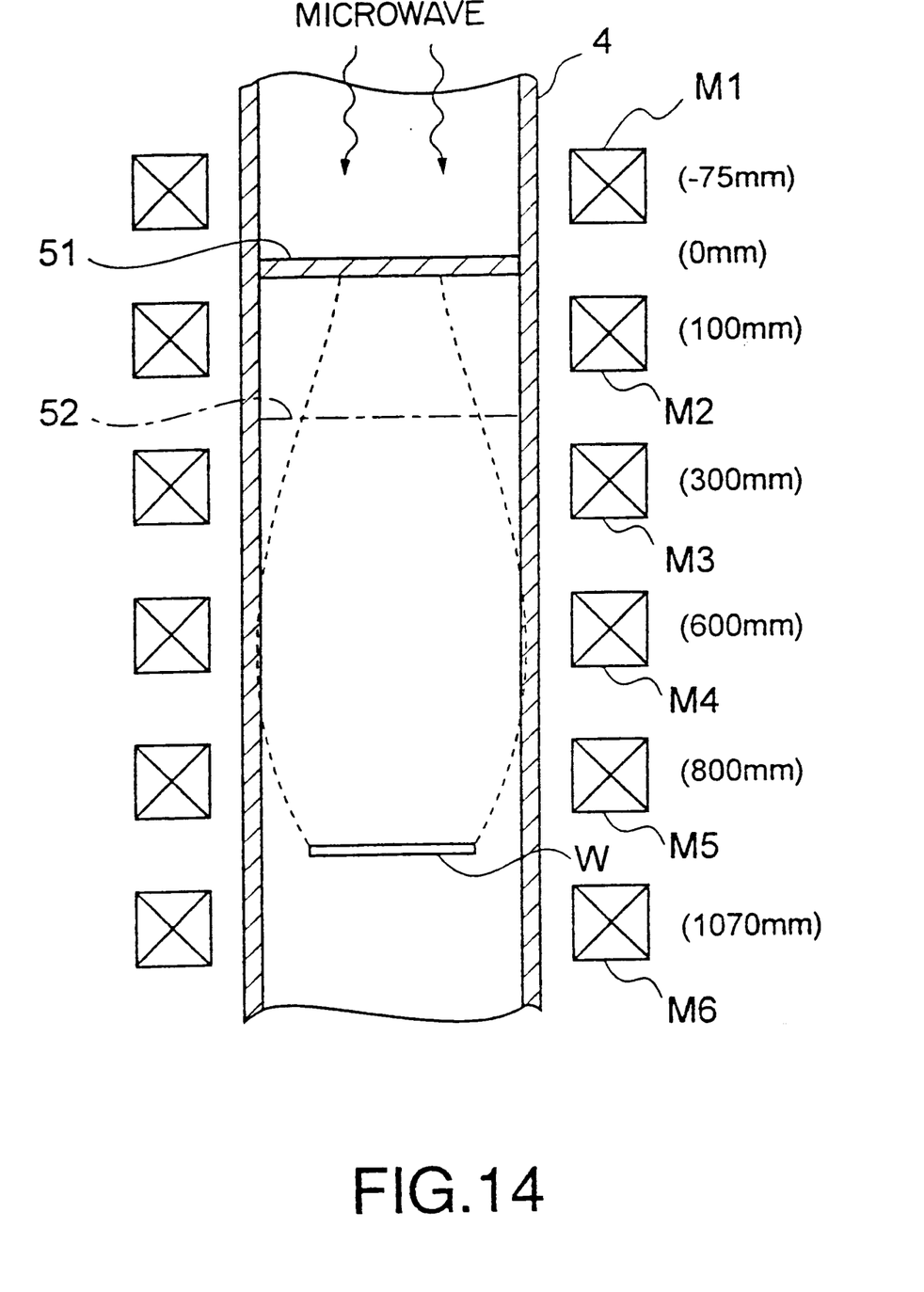
FIG. 14 is a schematic diagram showing an experimental device used for examining the distribution of electron density.
Figure 15:
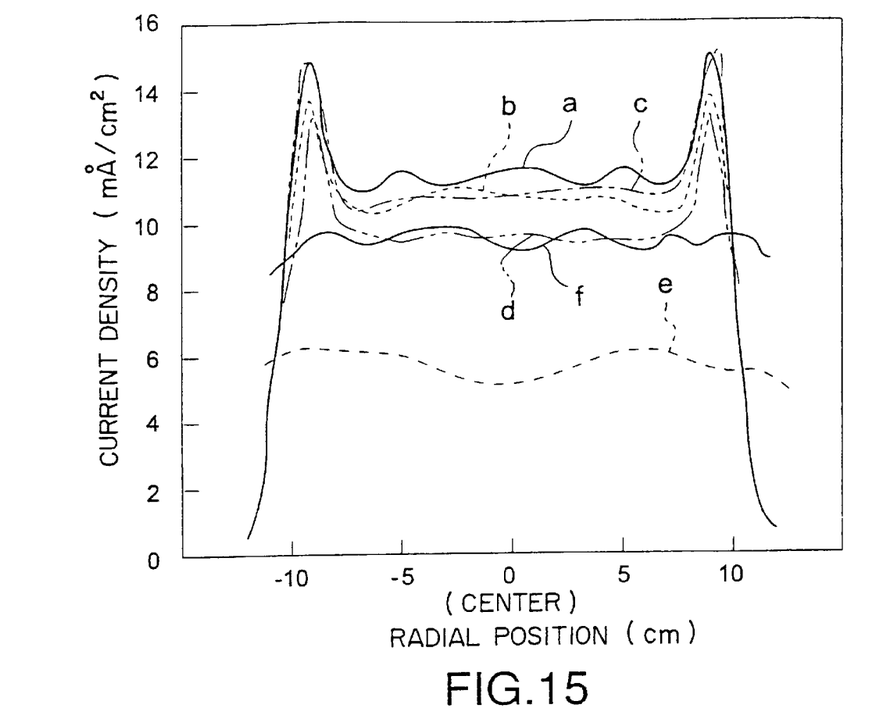
FIG. 15 is a schematic diagram showing the measured results of the distribution of electron density.

Using the experimental device shown in FIG. 7, the relationship between the shape of a magnetic field and an electron density in the vicinity of a wafer W was examined. In this experiment, six electromagnetic coils M1 through M6 were provided around a cylindrical vacuum vessel 4 having an inner diameter of 290 mm as shown in FIG. 14. The distances of the respective electromagnetic coils M1 through M6, which are put in parentheses on the right side of FIG. 14, indicate distances in a downstream direction from the position of a transmission window 51 for transmitting a microwave. For example, the coil M3 is spaced from the transmission window 51 by 300 mm in the longitudinal direction. However, the respective intervals between adjacent electromagnetic coils M1 through M6 are shown by the same intervals in FIG. 6 for convenience. In addition, an ECR point 52 is positioned between the coils M2 and M3, and the wafer W serving as a substrate to be treated is positioned at a position spaced from the transmission window 51 by 1000 mm. The currents flowing through the electromagnetic coils M1 through M3 and M6 were set to be 190 Å, and the currents flowing through the remaining two electromagnetic coils M4 and M5 were set to be any one of six current values between 10 Å through 100 Å as described later. Thus, the radial distribution of electron density in the vacuum vessel 4 was measured at a position upstream of the wafer W by 50 mm. Furthermore, He was introduced into the vacuum vessel 4 so that the pressure therein is 2 mmTorr, and other conditions were the same as those in the above described experiment. FIG. 15 shows the measured results. In FIG. 15, a shows a distribution pattern of electron density when the currents flowing through the electromagnetic coils M4 and M5 were set to be 10 Å. Similarly, b, c, d, e and f show distribution patterns of electron density when the currents flowing through the electromagnetic coils M4 and M5 were set to be 20 Å, 40 Å, 60 Å, 80 Å and 100 Å, respectively. When the currents flowing through the electromagnetic coils M4 and M5 are decreased, the magnetic field is expanded in this region, and the periphery of the magnetic field is positioned outside of the inner wall of the vacuum vessel 4 in the range of from 10 Å to 60 Å. That is, the lines of magnetic force cross the inner wall of the vacuum vessel 4. In this case, at the measuring point for electron density, the periphery of the magnetic field is biased inwardly from the inner wall by $\lambda/4$ or more, so that the pattern has high densities in the end portions due to the production of the X wave. On the other hand, when the currents flowing through the electromagnetic coils M4 and M5 are 80 Å or 100 Å, the expansion of the magnetic field is small, so that the lines of magnetic force do not cross the inner wall. Therefore, no X wave is produced at the measuring point, so that a predetermined distribution of electron density is not obtained.

The present invention should not be limited to the application to the thin film deposition treatment, but the invention may be applied to the etching of a $SiO_2$ film using, e.g., a fluorine gas.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A plasma treatment method that recognizes a relationship between X waves and plasma formation, said method comprising the steps of:

transferring a substrate to be treated in a cylindrical vacuum vessel having a magnetic field forming region so that said substrate is substantially perpendicular to an axis of said vacuum vessel;

propagating a microwave in the direction of said axis, and forming a magnetic field in said magnetic field forming region so that lines of magnetic force run along said axis of said vacuum vessel;

introducing a plasma producing gas into said vacuum vessel to thereby form a plasma in said vessel;

setting electron density, PD, of said plasma at a position corresponding to an electron cyclotron resonance point in a central portion in said magnetic field forming region so that $$0.46\ nc \leq PD < nc,$$

wherein nc is a n electron density that is an upper limit of an electron density range in which X waves are producible in said vessel; and treating said substrate with said plasma produced by electron cyclotron resonance, wherein said step of setting electron density creates a chevron distribution of electron density in which electron density at said position corresponding to said electron cyclotron resonance point is higher in a surrounding portion of said magnetic field forming region than a peak value of said electron density in said central portion.

2. A plasma treatment method as set forth in claim 1, wherein said magnetic field is formed so that the periphery of said magnetic field expands outside of an inner wall of a vacuum chamber of said vacuum vessel, downstream of said position corresponding to said electron cyclotron resonance with respect to the lines of magnetic force and the periphery of said magnetic field is positioned inside of said inner wall of said vacuum chamber by a distance of one fourth or more of the wavelength of an X wave more downstream thereof.

3. A plasma treatment method as set forth in claim 1, wherein said setting of electron density, PD, includes adjusting the magnitude of said microwave propogated in the direction of said axis.

4. A plasma treatment method as set forth in claim 1, wherein said setting of electron density, PD, includes adjusting a flow rate of said plasma producing gas introduced into said vacuum chamber.

5. A plasma treatment method as set forth in claim 1, wherein said setting of electron density, PD, includes adjusting pressure in said vacuum chamber.

6. A plasma treatment method as set forth in claim 1, wherein a position corresponding to an electron cyclotron resonance point in a surrounding portion of said magnetic field forming region is positioned at one of upstream of or in a same horizontal plane as that of said position corresponding to said electron cyclotron resonance in said central portion in said magnetic field forming region with respect to said lines of magnetic force which run along said axis of said vacuum vessel.

7. A plasma treatment method as set forth in claim 1, wherein said step of treating said substrate comprises a step of depositing a thin film on said substrate.

8. A plasma treatment method as set forth in claim 1, wherein said step of treating said substrate comprises a step of etching said substrate.

* * * * *